(12) United States Patent
Chen et al.

(10) Patent No.: US 8,546,952 B2
(45) Date of Patent: Oct. 1, 2013

(54) ELECTRICAL TEST STRUCTURE APPLYING 3D-ICS BONDING TECHNOLOGY FOR STACKING ERROR MEASUREMENT

(75) Inventors: Kuan-Neng Chen, Hsinchu (TW); Shih-Wei Li, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 12 days.

(21) Appl. No.: 13/294,183

(22) Filed: Nov. 11, 2011

(65) Prior Publication Data
US 2013/0062776 A1  Mar. 14, 2013

(30) Foreign Application Priority Data

Sep. 9, 2011 (TW) .............................. 100132705 A (51) Int. Cl.
*H01L 23/48* (2006.01)
(52) U.S. Cl.
USPC ........... 257/774; 438/455; 438/456; 438/459; 257/E21.521
(58) Field of Classification Search
USPC ............ 257/48, E21.521–E21.524, E21.614; 438/455–459, 406
See application file for complete search history.

(56) References Cited

U.S. PATENT DOCUMENTS

| | | | |
|---|---|---|---|
| 4,571,538 A | 2/1986 | Chow | |
| 6,080,597 A | 6/2000 | Moon | |
| 6,380,554 B1 * | 4/2002 | Bush et al. | 257/48 |
| 6,383,827 B1 * | 5/2002 | Lukanc et al. | 438/18 |
| 2006/0121690 A1 | 6/2006 | Pogge et al. | |
| 2008/0272372 A1 * | 11/2008 | Luo et al. | 257/48 |

FOREIGN PATENT DOCUMENTS

| | | | |
|---|---|---|---|
| JP | 2001-028464 | * | 1/2001 |
| KR | 10-2000-0031192 | | 6/2000 |
| KR | 10-2005-0090984 | | 9/2005 |

OTHER PUBLICATIONS

Masahiro et al. (JP 2001-028464 Machine Translation), Dec. 28, 2012.*
Canegallo et al., "Electrical Measurement of alignment for 3D stacked chips", Solid-State Circuits Conference, 2005. ESSCIRC 2005. Proceedings of the 31st European, Sep. 12, 2005, 347-350.
"First Office Action of Korea Counterpart Application" with English translation thereof, issued on Feb. 13, 2013, p. 1-p. 8.

* cited by examiner

*Primary Examiner* — Kyoung Lee
(74) *Attorney, Agent, or Firm* — Jianq Chyun IP Office (57) ABSTRACT

A 3D integrated circuit including a first wafer and a second wafer is provided. The first wafer includes a first conduction pattern. The second wafer includes a second conduction pattern which is electrically connected to the first conduction pattern. A displacement between the first wafer and the second wafer is determined by a resistance of the first conduction pattern and the second conduction pattern.

13 Claims, 8 Drawing Sheets

ELECTRICAL TEST STRUCTURE APPLYING 3D-ICS BONDING TECHNOLOGY FOR STACKING ERROR MEASUREMENT

CROSS-REFERENCE TO RELATED APPLICATION

This application claims the priority benefit of Taiwan application serial no. 100132705, filed on Sep. 9, 2011. The entirety of the above-mentioned patent application is hereby incorporated by reference herein and made a part of this specification.

BACKGROUND OF THE INVENTION

1. Field of the Invention

The invention relates to a three-dimensional integrated circuit. Particularly, the invention relates to a three-dimensional integrated circuit capable of measuring a stacking error.

2. Description of Related Art

Three-dimensional (3D) integrated circuits play an important role in effective use of an integrated circuit space in semiconductor applications, and devices fabricated by the integrated circuits may have different sizes due to different uses of the integrated circuit space. In development of the 3D integrated circuits, whether the integrated circuits on different wafers are accurately combined in the 3D space may influence functions and performance of the 3D integrated circuits.

A general technique for measuring whether the 3D integrated circuit is accurately stacked is to carve two paths having a certain resistance on a contact surface of the wafers, and use a through via technique to conduct measuring contacts on the paths to the wafer surface. When the measuring contacts of the two paths are measured to obtain the same resistance, it represents that the 3D integrated circuit is accurately stacked. Conversely, when the measuring contacts of the two paths are measured to obtain different resistances, it represents that the 3D integrated circuit is not accurately stacked, and a displacement error exists between the wafers. However, according to the conventional measuring method, a displacement amount and a displacement direction cannot be measured, so that is impossible to perform a correction in allusion to the displacement amount.

SUMMARY OF THE INVENTION

The invention is directed to a three-dimensional (3D) integrated circuit, which is capable of measuring a displacement generated due to wafer stacking, and obtaining a direction and a magnitude of the displacement.

The invention provides a three-dimensional (3D) integrated circuit including a first wafer and a second wafer. The first wafer includes a first conductive pattern. The second wafer includes a second conductive pattern, and is electrically connected to the first conductive pattern. A displacement between the first wafer and the second wafer is determined according to a resistance of the first conductive pattern and the second conductive pattern.

In an embodiment of the invention, the first conductive pattern includes a plurality of directional conductive patterns and a first central conductive pattern. At least one of the directional conductive patterns is electrically connected to the second conductive pattern. The first central conductive pattern is disposed among the directional conductive patterns, and is electrically connected to the second conductive pattern. Displacements of the first wafer and the second wafer in different directions are determined according to resistances of the first central conductive pattern, the corresponding directional conductive pattern and the second conductive pattern.

In an embodiment of the invention, the second conductive pattern includes a second central conductive pattern. The second central conductive pattern is electrically connected to the first conductive pattern. Displacements of the first wafer and the second wafer in the different directions are determined according to resistances of the first central conductive pattern, the corresponding directional conductive pattern and the second central conductive pattern.

In an embodiment of the invention, each of the directional conductive patterns includes a plurality of metal pads and a plurality of metal lines. Each of the metal lines is electrically connected to the corresponding metal pad. The resistance of the first conductive pattern and the second conductive pattern is at least determined according to a number of the metal lines short-circuited by the second conductive pattern and a line width of the short-circuited metal lines.

In an embodiment of the invention, each of the directional conductive patterns includes a metal pad, a doped region and a plurality of metal lines. The metal lines are electrically connected to the metal pad through the doped region. The resistance of the first conductive pattern and the second conductive pattern is at least determined according to a number of the metal lines short-circuited by the second conductive pattern and inter-line resistances of the short-circuited metal lines.

In an embodiment of the invention, the first conductive pattern includes a plurality of directional conductive patterns. The directional conductive patterns are electrically connected to the second conductive pattern. A displacement of the first wafer and the second wafer in a specific direction is determined according to resistances of the directional conductive patterns and the second conductive pattern.

In an embodiment of the invention, the second conductive pattern includes an island-chain conductive pattern. The island-chain conductive pattern is electrically connected to the directional conductive patterns. The directional conductive patterns and the island-chain conductive pattern are arranged in a daisy chain manner.

In an embodiment of the invention, each of the directional conductive patterns includes a plurality of metal pads, a doped region and a plurality of metal lines. The metal lines are electrically connected to the metal pads through the doped region. The resistance of the first conductive pattern and the second conductive pattern is at least determined according to a number of the metal lines short-circuited by the second conductive pattern, a number of the directional conductive patterns and inter-line resistances of the short-circuited metal lines.

In an embodiment of the invention, the first wafer further includes a third conductive pattern. The third conductive pattern and the first conductive pattern are disposed at two opposite sides of the first wafer.

In an embodiment of the invention, the third conductive pattern includes a plurality of metal pads. The resistances of the first conductive pattern and the second conductive pattern are measured by taking the metal pads as measuring contacts.

In an embodiment of the invention, the first conductive pattern and the third conductive pattern are electrically connected through a through-silicon via (TSV) technique.

According to the above descriptions, by measuring the resistance of the conductive patterns on the contact surface of the wafers in the 3D integrated circuit, the displacement error generated due to wafer stacking can be obtained.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

When an integrated circuit is measured, how to measure an internal circuit of the integrated circuit from a surface of the integrated circuit is a first problem encountered. In a conventional technique, a through-silicon via (TSV) technique is generally used for electrical connection. The TSV technique is used to drill vias for electrical connection, and metal pads are disposed on the surface of the wafer for measurement.

Figure 1:
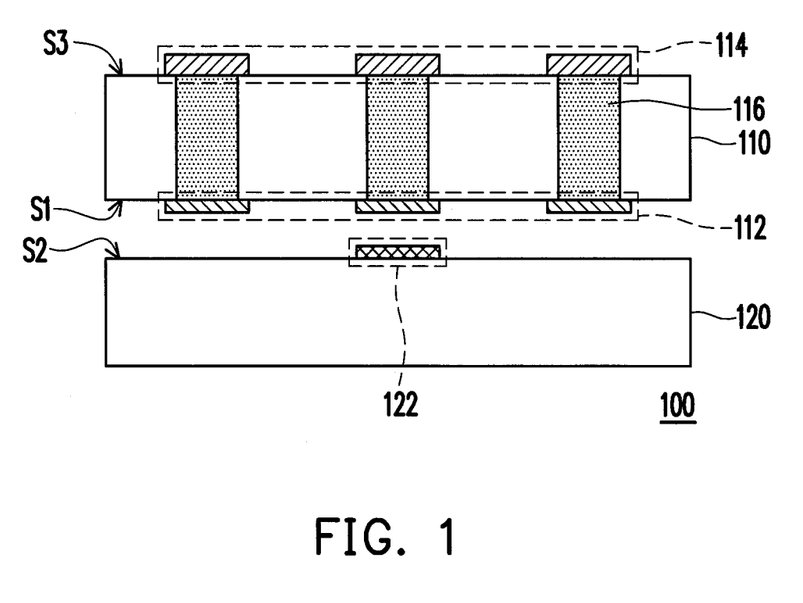
FIG. 1 is a schematic diagram of a three-dimensional (3D) integrated circuit 100 according to an embodiment of the invention.

FIG. 1 is a schematic diagram of a three-dimensional (3D) integrated circuit 100 according to an embodiment of the invention. Referring to FIG. 1, the 3D integrated circuit 100 of the present embodiment includes a first wafer 110 and a second wafer 120, where the first wafer 110 is stacked on the second wafer 120. In the present embodiment, the first wafer 110 includes a first conductive pattern 112 and a third conductive pattern 114, which are respectively disposed on surfaces S1 and S3 of the first wafer 110. The second wafer 120 includes a second conductive pattern 122, which is disposed on a surface S2 of the second wafer 120, and is electrically connected to the first conductive pattern 112. In the present embodiment, the first conductive pattern 112 and the third conductive pattern 114 are electrically connected through a plurality of TSVs 116, so that an electrical measuring apparatus (not shown) can measure a resistance of the first conductive pattern 112 and the second conductive pattern 122 through a plurality of metal pads of the third conductive pattern 114. A displacement between the first wafer 110 and the second wafer 120 is determined according to the resistance of the first conductive pattern 112 and the second conductive pattern 122.

Figure 2A:
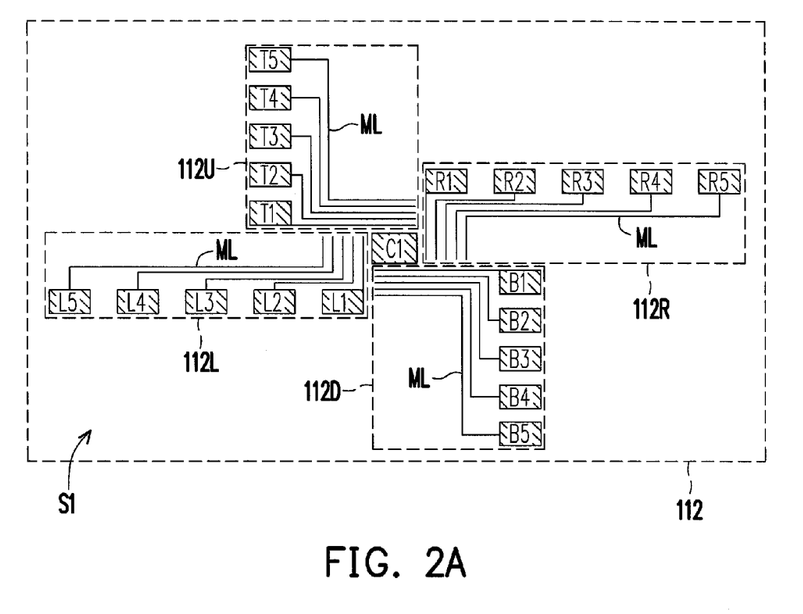
FIG. 2A is a schematic diagram illustrating a configuration of a first conductive pattern 112 of FIG. 1.

FIG. 2A is a schematic diagram illustrating a configuration of the first conductive pattern 112 of FIG. 1. Referring to FIG. 1 and FIG. 2A, in the present embodiment, the first conductive pattern 112 includes a central conductive pattern C1 and a plurality of directional conductive patterns 112U, 112D, 112L and 112R. The central conductive pattern C1 is disposed among the directional conductive patterns 112U, 112D, 112L and 112R, and is electrically connected to the second conductive pattern 122. Here, the central conductive pattern C1 is a rectangular metal pad, and is disposed at the center of the first conductive pattern 112, though the invention is not limited thereto.

In the present embodiment, each of the directional conductive patterns 112U, 112D, 112L and 112R includes a plurality of metal pads and a plurality of metal lines. The metal pads are sequentially connected to the metal lines. In the present embodiment, the directional conductive patterns 112U, 112D, 112L and 112R are respectively disposed at top, bottom, left and right of the first conductive pattern 112, and the central conductive pattern C1 is encircled by the directional conductive patterns 112U, 112D, 112L and 112R. In the present embodiment, the resistance of the first conductive pattern 112 and the second conductive pattern 122 is at least determined according to a number of the metal lines ML short-circuited by the second conductive pattern 122 and a line width of the short-circuited metal lines ML, which is described later in collaboration with the second conductive pattern 122. It should be noticed that the terms of "top", "bottom", "left" and "right" are for the purpose of describing directions in FIG. 2 and are not intended to be limiting of the invention.

Figure 2B:
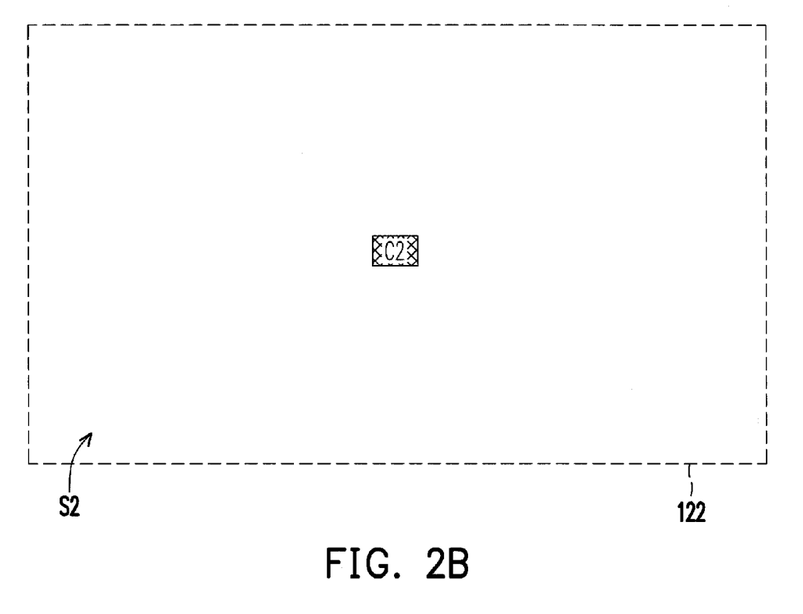
FIG. 2B is a schematic diagram illustrating a configuration of a second conductive pattern 122 of FIG. 1.

FIG. 2B is a schematic diagram illustrating a configuration of the second conductive pattern 122 of FIG. 1. Referring to FIG. 1 to FIG. 2B, the second conductive pattern 122 includes a central conductive pattern C2. The central conductive pattern C2 is disposed on the surface S2 of the second wafer 120 at a place corresponding to a position of the central conductive pattern C1. In accordance with the central conductive pattern C1 of the first conductive pattern 112, the central conductive pattern C2 is also a rectangular metal pad, though the invention is not limited thereto. When the first wafer 110 and the second wafer 120 are stacked, if none error exists there between, the central conductive pattern C2 is substantially overlapped to the central conductive pattern C1. Comparatively, if an error exists between the wafers 110 and 120, the central conductive pattern C2 is not only overlapped to the central conductive pattern C1, but is also overlapped to a part of the metal lines ML of the directional conductive patterns 112U, 112D, 112L and 112R, so that the first wafer 110 and the second wafer 120 have different conduction states due to different stacking relations there between. In other words, the conduction states of the first conductive pattern 112 and the second conductive pattern 122 are at least varied according to the number of the metal lines ML short-circuited by the second conductive pattern 122.

Figure 2C:
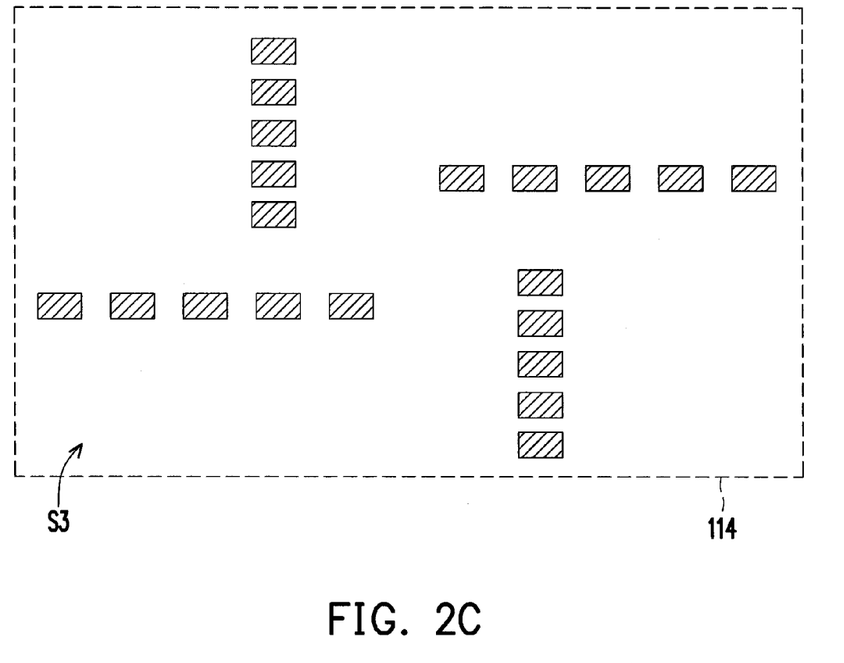
FIG. 2C is a schematic diagram illustrating a configuration of a third conductive pattern 114 of FIG. 1.

FIG. 2C is a schematic diagram illustrating a configuration of the third conductive pattern 114 of FIG. 1. Referring to FIG. 1 to FIG. 2C, the third conductive pattern 114 is disposed on the surface S3 of the first wafer 110 opposite to the first conductive pattern 112. The third conductive pattern 114 includes a plurality of metal pads, which are one-to-one configured corresponding to the metal pads of the first conductive pattern 112, and are electrically connected to the metal pads on the surface S1 of the first wafer 110 through the TSVs. The electrically measuring apparatus (not shown) can measure the conduction state of the first conductive pattern 112 and the second conductive pattern 122 through the metal pads of the third conductive pattern 114.

Figure 3:
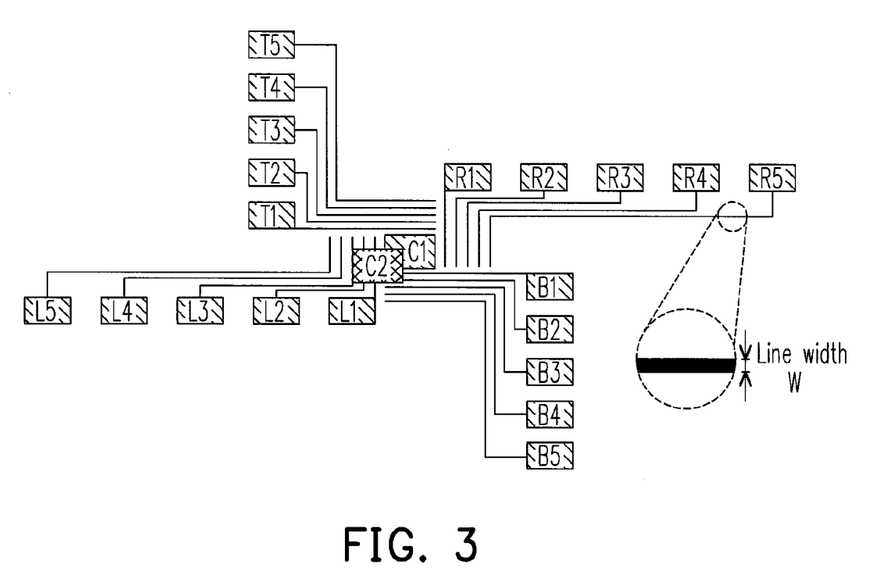
FIG. 3 is a schematic diagram illustrating mismatch of the first conductive pattern 112 and the second conductive pattern 122 of FIG. 1.

FIG. 3 is a schematic diagram illustrating mismatch of the first conductive pattern 112 and the second conductive pattern 122 of FIG. 1. Referring to FIG. 1 to FIG. 3, in the present embodiment, if stacking between the first conductive pattern 112 and the second conductive pattern 122 has an error, the central conductive pattern C2 is not only overlapped to the central conductive pattern C1, but is also overlapped to a part of the metal lines ML of the directional conductive patterns 112U, 112D, 112L and 112R, so that the first wafer 110 and the second wafer 120 may have different short-circuit states due to different stacking displacement errors.

In detail, in the structure of FIG. 1, the 3D integrated circuit 100 includes a plurality of TSVs 116 and simple metal connections (i.e. the metal lines and the metal pads). In this way, after the first wafer 110 and the second wafer 120 are combined, displacements of different directions (i.e. errors in alignment) thereof can be measured, and a working principle is as follows. When the first wafer 110 and the second wafer 120 are combined, the central conductive pattern C2 on the surface S2 of the second wafer 120 contacts the metal lines ML on the surface S1 of the first wafer 110, so as to conduct the TSV 116 corresponding to the central conductive pattern C1 and the TSVs 116 corresponding to the other metal pads. According to the number of the above conductions and positions thereof, the alignment error of the first wafer 110 and the second wafer 120 after combination is obtained.

For example, in FIG. 3, the first wafer 110 and the second wafer 120 have a displacement error after combination, and the metal pads L1, L2 and L3, the metal pads B1 and B2, and the central conductive pattern C1 are short-circuited, and the other metal lines are open-circuit. Therefore, the displacement error of the 3D integrated circuit 100 is three line widths (3W) at the left and two line widths (2W) at the bottom. In other words, the resistance of the first conductive pattern 112 and the second conductive pattern 122 is at least determined by the number of the metal lines ML short-circuited by the second conductive pattern 122 and the line width of the short-circuited metal lines ML. Moreover, the displacement between the first wafer 110 and the second wafer 120 is determined according to the conduction state of the first conductive pattern 112 and the second conductive pattern 122. Namely, the displacement is equal to the number of the metal lines ML short-circuited by the second conductive pattern 122 times the line width of the metal line ML. In the present embodiment, a method of determining the wafer displacement according to the conduction number (a number of low resistances) of the conductive pattern is, for example, to record a corresponding relationship between the wafer displacements and the resistances of the conductive patterns in a look-up table. When the low resistance of the conductive patterns is measured, the wafer displacement can be determined by looking up the corresponding relationship recorded in the look-up table. Moreover, the corresponding relationship recorded in the look-up table is varied along with different design structures of the first conductive pattern 112 and the second conductive pattern 122.

Therefore, the 3D integrated circuit 100 of the present embodiment at least has advantages of simple fabrication, simple decision (i.e. the displacement error is determined according to electrical property), and making decision based on whether the metal line is conducted, and none use of any active/passive device, etc. Moreover, the first conductive pattern 112 of the present embodiment does not require a doping process during fabrication, by which a thermal budget phenomenon is mitigated.

It should be noticed that in the present embodiment, the number of the metal pads and the line width of the metal lines ML are not limited by the invention. A designer can adjust the numbers of the metal pads of the directional conductive patterns 112U, 112D, 112L and 112R according to an actual design requirement, and the numbers thereof are not required to be the same. Moreover, the line widths of the metal lines ML can also be arbitrarily adjusted, and the line widths of the metal lines are not required to be the same.

Figure 4:
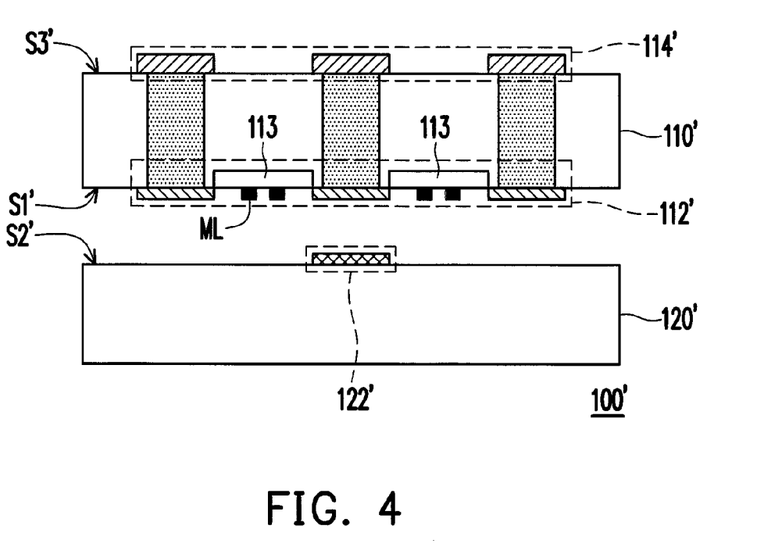
FIG. 4 is a schematic diagram of a 3D integrated circuit 100' according to another embodiment of the invention.

FIG. 4 is a schematic diagram of a 3D integrated circuit 100' according to another embodiment of the invention. Referring to FIG. 1 and FIG. 4, the 3D integrated circuit 100' of the present embodiment is similar to the 3D integrated circuit 100 of FIG. 1, though a main difference there between is that a first conductive pattern 112' and a third conductive pattern 114' of the 3D integrated circuit 100' of the present embodiment have relatively less metal pads.

Figure 5A:
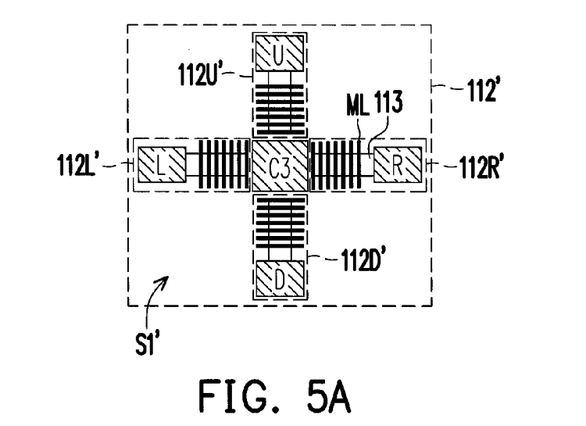
FIG. 5A is a schematic diagram of a configuration of a first conductive pattern 112' of FIG. 4.

In detail, FIG. 5A is a schematic diagram of a configuration of the first conductive pattern 112' of FIG. 4. Referring to FIG. 4 to FIG. 5A, compared to the embodiment of FIG. 1, directional conductive patterns 112U', 112D', 112L' and 112R' of the present embodiment respectively includes a metal pad, a doped region and a plurality of metal lines. Taking the directional conductive pattern 112D' as an example, it includes a metal pad D, a doped region 113 and a plurality of metal lines ML. The doped region 113 is, for example, fabricated while the doped region of the 3D integrated circuit 100 is fabricated, which is used for conducting a central conductive pattern C3 and the metal lines ML. The metal lines ML are arranged on the corresponding doped region 113 in parallel.

Figure 5B:
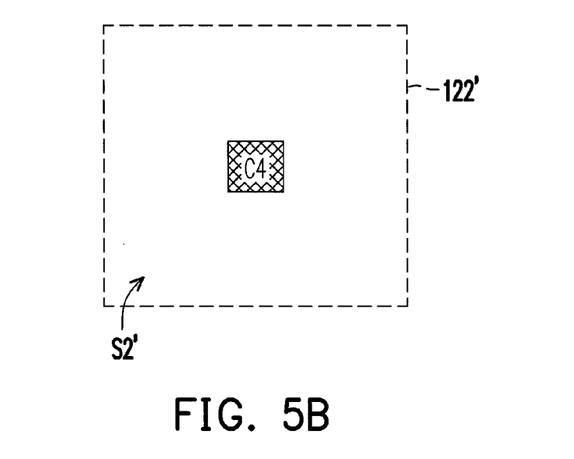
FIG. 5B is a schematic diagram of a configuration of a second conductive pattern 122' of FIG. 4.

FIG. 5B is a schematic diagram of a configuration of the second conductive pattern 122' of FIG. 4. Referring to FIG. 4 to FIG. 5B, similar to the second conductive pattern 122 of FIG. 2B, the second conductive pattern 122' of the present embodiment includes a central conductive pattern C4, which is disposed at the center of the second conductive pattern 122' corresponding to a position of the central conductive pattern C3, where the central conductive pattern C4 is also a rectangular metal pad, though the invention is not limited thereto.

Figure 5C:
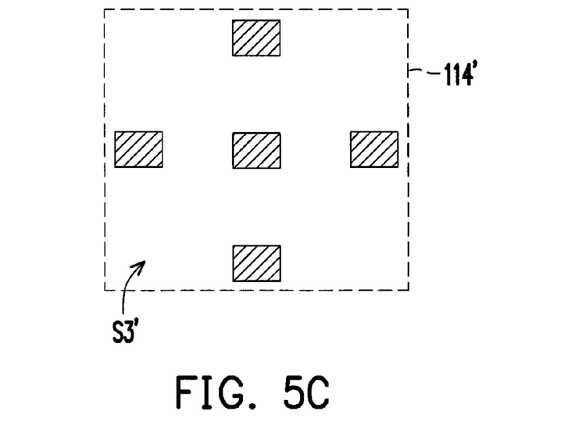
FIG. 5C is a schematic diagram of a configuration of a third conductive pattern 114' of FIG. 4.

FIG. 5C is a schematic diagram of a configuration of the third conductive pattern 114' of FIG. 4. Referring to FIG. 4 to FIG. 5C, compared to the embodiment of FIG. 2C, since each of the directional conductive patterns of the present embodiment only includes one metal pad, the third conductive pattern 114' only has five metal pads (including one metal pad corresponding to the central conductive pattern C3). Therefore, according to the number of the metal pads of the first conductive pattern 112' and the third conductive pattern 114', the first wafer 110' only requires five TSVs 116'. Therefore, the 3D integrated circuit 100' of the present embodiment at least has advantages of simple fabrication, less number of the TSVs, and low cost, etc.

Figure 6:
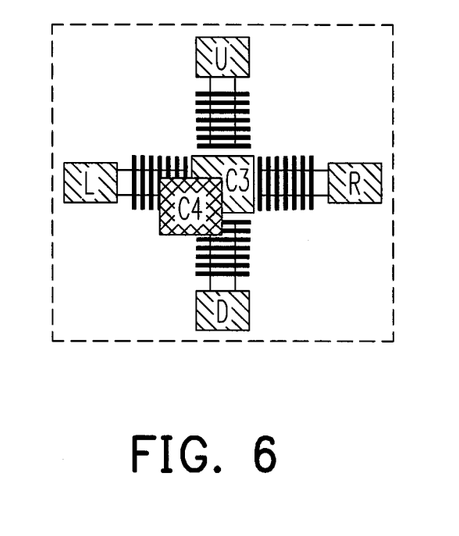
FIG. 6 is a schematic diagram illustrating mismatch of the first conductive pattern 112' and the second conductive pattern 122' of FIG. 4.

FIG. 6 is a schematic diagram illustrating mismatch of the first conductive pattern 112' and the second conductive pattern 122' of FIG. 4. Referring to FIG. 4 to FIG. 6, in the present embodiment, if stacking between the first conductive pattern 112' and the second conductive pattern 122' has an error, the central conductive pattern C4 is not only overlapped to the central conductive pattern C3, but is also overlapped to a part of the metal lines ML of the directional conductive patterns 112U', 112D', 112L' and 112R', so that the first wafer 110' and the second wafer 120' may have different resistances due to different stacking relationships.

In detail, in the structure of FIG. 4, each of the metal lines of the directional conductive patterns has a fixed inter-line resistance based on a doping method of the 3D integrated circuit 100'. Once the first wafer 110' and the second wafer 120' have a displacement, the central conductive pattern C4 on a surface S2' of the second wafer 120' contacts the metal lines ML on a surface S1' of the first wafer 110', and the metal lines ML contacting the central conductive pattern C4 are short-circuited without being influenced by the resistance of the doped region 113 below the metal lines ML. Then, by measuring the metal pads on a surface S3' of the first wafer 110' through the TSVs 116', the resistance of the first conductive pattern 112' and the second conductive pattern 122' is obtained, and then the displacement error between the first wafer 110' and the second wafer 120' is determined according to the resistance.

For example, in FIG. 6, the first wafer 110' and the second wafer 120' has a displacement error after combination, and the central conductive pattern C4 is shifted to the lower left relative to the central conductive pattern C3, as that shown in FIG. 6. Assuming the inter-line resistance of each of the metal lines is r, a resistance between each of the metal pads L, U, R and D of the directional conductive patterns and the central conductive pattern C3 is $R_W$, a plurality of resistances of the first conductive pattern 112' and the second conductive pattern 122' are as follows:

$$R_{C3U}=R_{C3R}=R_W$$

$$R_{C3L}=R_W-4\times r$$

$$R_{C3D}=R_W-2\times r$$

Where $R_{C3U}$, $R_{C3R}$, $R_{C3L}$ and $R_{C3D}$ are respectively resistances between the central conductive pattern C3 and the directional conductive patterns 112U', 112R', 112L' and 112D'.

In other words, the resistance of the first conductive pattern 112' and the second conductive pattern 122' is at least determined according to the number of the metal lines ML short-circuited by the second conductive pattern 122' and the inter-line resistances of the short-circuited metal lines. Moreover, the displacement between the first wafer 110' and the second wafer 120' is determined according to the resistance of the first conductive pattern 112' and the second conductive pattern 122'. Namely, the displacement is equal to the resistance between the metal pad of the directional conductive pattern and the central conductive pattern minus the number of the metal lines ML short-circuited by the second conductive pattern 122' times the inter-line resistance of the metal line ML.

Figure 7:
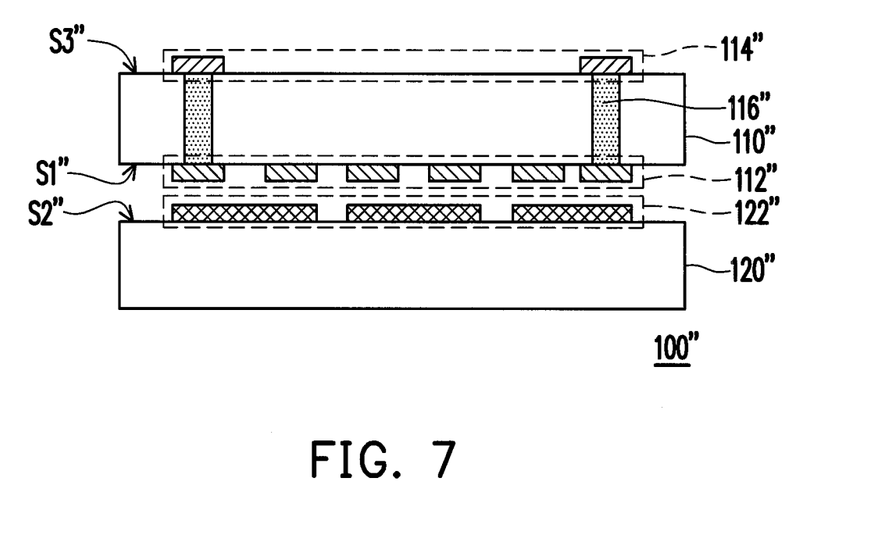
FIG. 7 is a schematic diagram of a 3D integrated circuit 100" according to another embodiment of the invention.

FIG. 7 is a schematic diagram of a 3D integrated circuit 100" according to another embodiment of the invention. Referring to FIG. 4 and FIG. 7, the 3D integrated circuit 100" of the present embodiment is similar to the 3D integrated circuit 100' of FIG. 4, though a main difference there between is that a first conductive pattern 112" of the present embodiment includes a plurality of directional conductive patterns 112Y arranged along a specific direction, and a second conductive pattern 122" of the present embodiment includes an island-chain conductive pattern, which is electrically connected to the directional conductive patterns 112Y.

Figure 8A:
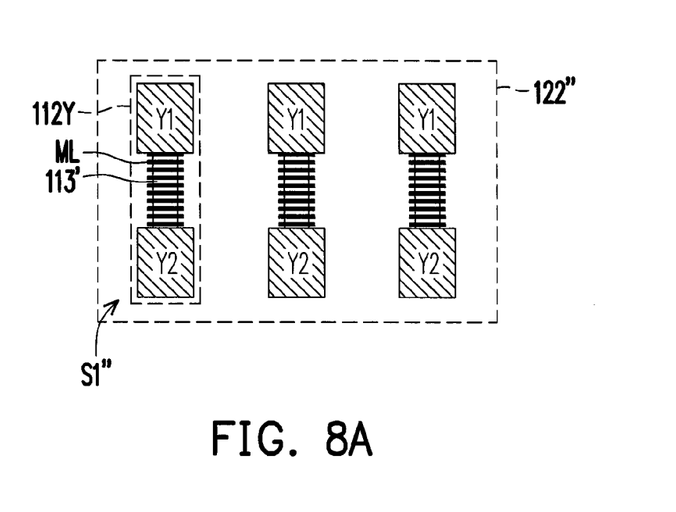
FIG. 8A is a schematic diagram of a configuration of a first conductive pattern 112" of FIG. 7.

In detail, FIG. 8A is a schematic diagram of a configuration of the first conductive pattern 112" of FIG. 7. Referring to FIG. 7 and FIG. 8A, each of the directional conductive patterns 112Y includes two metal pads Y1 and Y2, a doped region 113' and a plurality of metal lines ML. The doped region 113' is, for example, fabricated while the doped region of the 3D integrated circuit 100" is fabricated, which is used for conducting the metal pads Y1 and Y2 of each of the directional conductive patterns and the corresponding metal lines ML. The metal lines ML are arranged on the corresponding doped region 113' in parallel. In the present embodiment, the directional conductive patterns 112Y are arranged along a horizontal direction for measuring a displacement of a first wafer 110" and a second wafer 120" along a vertical direction. It should be noticed that the terms "vertical" and "horizontal" are for the purpose of describing directions in FIG. 8A, and are not intended to limit the configuration of the directional conductive pattern of the invention.

Figure 8B:
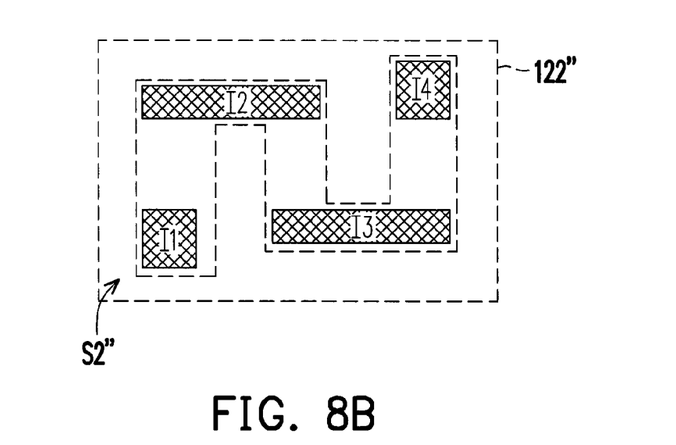
FIG. 8B is a schematic diagram of a configuration of a second conductive pattern 122" of FIG. 7.

FIG. 8B is a schematic diagram of a configuration of the second conductive pattern 122" of FIG. 7. Referring to FIG. 7 to FIG. 8B, the second conductive pattern 122" of the present embodiment includes a plurality of rectangular metal pads I1, I2, I3 and I4, which are arranged in a chain-type pattern shown in FIG. 8B in collaboration with the configuration of the first conductive pattern 112", and are referred to as the island-chain conductive pattern, though it is not used to limit the second conductive pattern 122" of the invention. The resistance of the first conductive pattern 112" and the second conductive pattern 122" is at least determined according to the number of the metal lines ML short-circuited by the second conductive pattern 122", the number of the directional conductive patters 112Y and the inter-line resistances of the short-circuited metal lines.

Figure 8C:
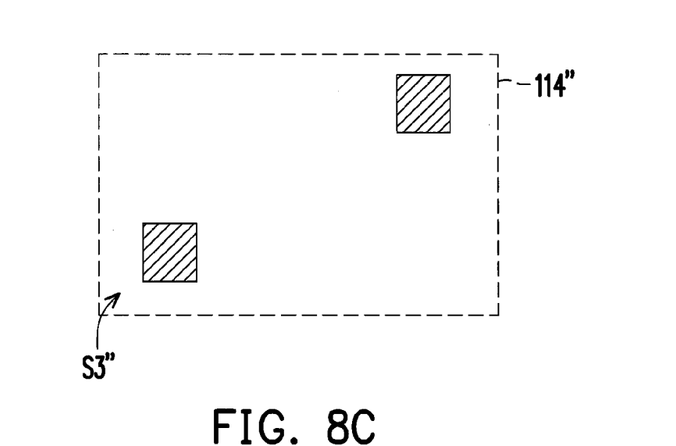
FIG. 8C is a schematic diagram of a configuration of a third conductive pattern 114" of FIG. 7.

FIG. 8C is a schematic diagram of a configuration of the third conductive pattern 114" of FIG. 7. Referring to FIG. 7 to FIG. 8C, the third conductive pattern 114" of the present embodiment includes a plurality of rectangular metal pads configured in collaboration with the first conductive pattern 112" as that shown in FIG. 8C. In the present embodiment, the third conductive pattern 114" only includes two rectangular metal pads, and when the first conductive pattern 112" contacts the second conductive pattern 122", measurement can be performed through the two rectangular metal pads. In other words, only two TSVs 116" are required to be configured between the first conductive pattern 112" and the third conductive pattern 114" for measuring the resistance of the first conductive pattern 112" and the second conductive pattern 122", which may effectively reduce the fabrication cost.

Figure 9:
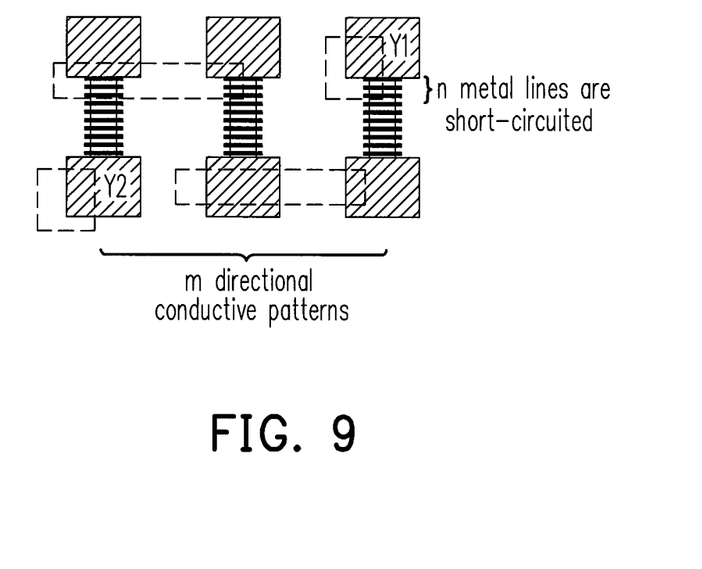
FIG. 9 is a schematic diagram illustrating mismatch of the first conductive pattern 112" and the second conductive pattern 122" of FIG. 7.

Further, FIG. 9 is a schematic diagram illustrating mismatch of the first conductive pattern 112" and the second conductive pattern 122" of FIG. 7. Referring to FIG. 7 to FIG. 9, in the present embodiment, if stacking between the first conductive pattern 112" and the second conductive pattern 122" has an error along the vertical direction, the second conductive pattern 122" is not only overlapped to the metal pads Y1 and Y2 of the directional conductive patterns 112Y, but is also overlapped to a part of the metal lines ML, so that the first wafer 110" and the second wafer 120" may have different resistances due to different stacking relationships.

In the structure of FIG. 7, each of the metal lines ML on a surface S1" of the first wafer 110" has a fixed inter-line resistance based on a doping method. Now, if the first wafer 110' and the second wafer 120' have a vertical displacement after combination, a current generated during measurement can flow through the directional conductive patterns of the first conductive pattern 112" and the island-chain conductive pattern of the second conductive pattern 122" which are arranged in a daisy chain manner. The generated current enhances the resistance generated due to the displacement.

For example, in FIG. 7, the first wafer 110" and the second wafer 120" has a displacement error after combination, and the second conductive pattern 122" is shifted to the lower left relative to the first conductive pattern 112", as that shown in FIG. 9. Assuming the inter-line resistance of each of the metal lines is ρ, a number of the directional conductive patterns is m, and a number of the metal lines ML short-circuited by the second conductive pattern 122" is n, a resistance ΔR measured between the lower left metal pad Y2 and the top right metal pad Y1 is as follows:

$$\Delta R = m \times n \times \rho$$

In the present embodiment, m=3 and n=9. In other words, the resistance of the first conductive pattern 112" and the second conductive pattern 122" is at least determined according to the number of the metal lines ML short-circuited by the second conductive pattern 122", the number of the directional conductive patterns 112Y and the inter-line resistances of the short-circuited metal lines. The designer can adjust the number of the directional conductive patterns 112Y and the number of the metal lines ML short-circuited by the second conductive pattern 122" according to an actual design requirement, so that the resistance generated due to the displacement of the first wafer 110" and the second wafer 120" can be effectively enhanced to enhance sensitivity of displacement measurement. Moreover, the embodiment of FIG. 1 or the embodiment of FIG. 4 can also be used in collaboration with the embodiment of FIG. 7 to enhance the sensitivity of displacement measurement.

It should be noticed that in the present embodiment, the directional conductive patterns are arranged along the horizontal direction for measuring the displacement of the first wafer 110" and the second wafer 120" along the vertical direction, though the invention is not limited thereto. In other embodiments, the directional conductive patterns can also be arranged along the vertical direction for measuring the displacement of the first wafer 110" and the second wafer 120" along the horizontal direction. In another embodiment, the 3D integrated circuit 100" can also be configured with two sets of the directional conductive patterns arranged along different directions to measure displacements of different directions.

In summary, in the invention, by measuring the resistance of the conductive patterns on the contact surface of the wafers in the 3D integrated circuit, the displacement error generated due to wafer stacking can be obtained. Moreover, the structures of the embodiments of the invention can also be implemented in a same 3D integrated circuit to enhance the sensitivity of displacement measurement.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A three-dimensional (3D) integrated circuit, comprising:
a first wafer comprising a first conductive pattern; and
a second wafer comprising a second conductive pattern, and electrically connected to the first conductive pattern, wherein a displacement between the first wafer and the second wafer is determined according to a resistance of the first conductive pattern and the second conductive pattern,
wherein the first conductive pattern comprises:
a plurality of directional conductive patterns, wherein at least one of the directional conductive patterns is electrically connected to the second conductive pattern; and
a first central conductive pattern disposed among the directional conductive patterns, and electrically connected to the second conductive pattern;
wherein displacements of the first wafer and the second wafer in different directions are determined according to resistances of the first central conductive pattern, the corresponding directional conductive pattern and the second conductive pattern.

2. The 3D integrated circuit as claimed in claim 1, wherein the second conductive pattern comprises:
a second central conductive pattern, electrically connected to the first conductive pattern,
wherein displacements of the first wafer and the second wafer in the different directions are determined according to resistances of the first central conductive pattern, the corresponding directional conductive pattern and the second central conductive pattern.

3. The 3D integrated circuit as claimed in claim 1, wherein each of the directional conductive patterns comprises:
a plurality of metal pads; and
a plurality of metal lines, wherein each of the metal lines is electrically connected to the corresponding metal pad;
wherein the resistance of the first conductive pattern and the second conductive pattern is at least determined according to a number of the metal lines short-circuited by the second conductive pattern and a line width of the short-circuited metal lines.

4. The 3D integrated circuit as claimed in claim 1, wherein each of the directional conductive patterns comprises:
a metal pad;
a doped region; and
a plurality of metal lines electrically connected to the metal pad through the doped region,
wherein the resistance of the first conductive pattern and the second conductive pattern is at least determined according to a number of the metal lines short-circuited by the second conductive pattern and inter-line resistances of the short-circuited metal lines.

5. The 3D integrated circuit as claimed in claim 1, wherein the first wafer further comprises:
a third conductive pattern, wherein the third conductive pattern and the first conductive pattern are disposed at two opposite sides of the first wafer.

6. The 3D integrated circuit as claimed in claim 5, wherein the third conductive pattern comprises a plurality of metal pads, and the resistance of the first conductive pattern and the second conductive pattern is measured by taking the metal pads as measuring contacts.

7. The 3D integrated circuit as claimed in claim 5, wherein the first conductive pattern and the third conductive pattern are electrically connected through a through-silicon via (TSV) technique.

8. A three-dimensional (3D) integrated circuit, comprising:
a first wafer comprising a first conductive pattern; and
a second wafer comprising a second conductive pattern, and electrically connected to the first conductive pattern, wherein a displacement between the first wafer and the second wafer is determined according to a resistance of the first conductive pattern and the second conductive pattern, wherein the second conductive pattern comprises:

an island-chain conductive pattern electrically connected to a plurality of directional conductive patterns, and the directional conductive patterns and the island-chain conductive pattern are arranged in a daisy chain manner, wherein the island-chain conductive pattern comprises a plurality of metal pads, and a current generated during measurement flows into one of the metal pads of the island-chain conductive pattern and flows out of another one of the metal pads of the island-chain conductive pattern.

9. The 3D integrated circuit as claimed in claim 8, wherein the first conductive pattern comprises:

the plurality of directional conductive patterns electrically connected to the second conductive pattern, wherein a displacement of the first wafer and the second wafer in a specific direction is determined according to resistances of the directional conductive patterns and the second conductive pattern.

10. The 3D integrated circuit as claimed in claim 9, wherein each of the directional conductive patterns comprises:

a plurality of metal pads;
a doped region; and
a plurality of metal lines electrically connected to the metal pads of the directional conductive pattern through the doped region, wherein the resistance of the first conductive pattern and the second conductive pattern is at least determined according to a number of the metal lines short-circuited by the second conductive pattern, a number of the directional conductive patterns and inter-line resistances of the short-circuited metal lines.

11. The 3D integrated circuit as claimed in claim 8, wherein the first wafer further comprises:

a third conductive pattern, wherein the third conductive pattern and the first conductive pattern are disposed at two opposite sides of the first wafer.

12. The 3D integrated circuit as claimed in claim 11, wherein the third conductive pattern comprises a plurality of metal pads, and the resistance of the first conductive pattern and the second conductive pattern is measured by taking the metal pads of the third conductive pattern as measuring contacts.

13. The 3D integrated circuit as claimed in claim 11, wherein the first conductive pattern and the third conductive pattern are electrically connected through a through-silicon via (TSV) technique.

* * * * *